United States Patent
Yeh et al.

(10) Patent No.: US 8,983,403 B2
(45) Date of Patent: Mar. 17, 2015

(54) FREQUENCY COMPENSATION DEVICE AND FREQUENCY COMPENSATION METHOD THEREOF

(71) Applicant: Gemtek Technology Co., Ltd., Hukou Township, Hsinchu County (TW)

(72) Inventors: Fu-Ming Yeh, Hukou Township, Hsinchu County (TW); You-Chang Shih, Hukou Township, Hsinchu County (TW)

(73) Assignee: Gemtek Technology Co., Ltd., Hukou Township, Hsinchu County (TW)

( * ) Notice: Subject to any disclaimer, the term of this patent is extended or adjusted under 35 U.S.C. 154(b) by 219 days.

(21) Appl. No.: 13/756,001

(22) Filed: Jan. 31, 2013

(65) Prior Publication Data

US 2014/0213312 A1 Jul. 31, 2014

(51) Int. Cl.
*H04B 1/40* (2006.01)
*H03J 7/00* (2006.01)
*H04L 27/00* (2006.01)
*H04W 88/00* (2009.01)

(52) U.S. Cl.
CPC . *H03J 7/00* (2013.01); *H04L 27/00* (2013.01); *H04W 88/00* (2013.01)
USPC ........... 455/75; 455/561; 455/67.11; 455/313

(58) Field of Classification Search
CPC .................................. H04B 1/403; H04B 1/50
USPC ........... 455/562.1, 67.14, 67.11, 75, 73, 275, 455/276.1, 161.1, 205, 227, 313, 509; 375/332, 340, 373; 327/144, 237
See application file for complete search history.

(56) References Cited

U.S. PATENT DOCUMENTS

| | | | |
|---|---|---|---|
| 8,005,182 B2 * | 8/2011 | Park et al. | 375/373 |
| 8,531,216 B1 * | 9/2013 | Wu et al. | 327/144 |
| 8,536,952 B2 * | 9/2013 | Akaike et al. | 331/158 |
| 2012/0299629 A1 * | 11/2012 | Ogasahara | 327/237 |

* cited by examiner

*Primary Examiner* — John J Lee
(74) *Attorney, Agent, or Firm* — Muncy, Geissler, Olds & Lowe, P.C.

(57) ABSTRACT

A frequency compensation device, applicable to a user equipment (UE) communicating with a first base station (BS), includes a receiving module and a transmitting module. The receiving module has an offset detection unit for performing following steps. A first signal from the first BS at a first receiving frequency is received. A first transmitting frequency where the first BS transmits the at least one first signal is read. A difference between the first transmitting frequency and the first receiving frequency is calculated and used as a frequency difference. The transmitting module is for performing following steps. A BS parameter corresponding to the first BS is obtained. A frequency compensation value according to the BS parameter is calculated. A second transmitting frequency according to the frequency compensation value corresponding to the first BS is compensated. A second signal to the first BS at the compensated second transmitting frequency is sent.

15 Claims, 8 Drawing Sheets

FREQUENCY COMPENSATION DEVICE AND FREQUENCY COMPENSATION METHOD THEREOF

TECHNICAL FIELD

The disclosure relates to a frequency compensation device and a frequency compensation method thereof, and in particular, to a frequency compensation device and a frequency compensation method thereof that compensate for the Doppler Effect.

BACKGROUND

A wireless communication system enables two wireless communication devices to transmit data with each other in a wireless manner by means of different modulation technologies. However, the two sides of communication usually use asynchronous clock frequency systems, so a Carrier Frequency Offset (CFO) is generated between frequencies used at the two sides, leading to an error in signal decoding.

In a point-to-point (PtoP) system, receivers at both sides can solve the problem through respective frequency compensation technologies. In other words, both sides make compensation for a certain object. However, in a point-to-multipoint (PtoMP) system where one Base Station (BS) communicates with a plurality of User Equipments (UEs), the BS, as a host end, fails to adjust the receiving frequency for each UE. Therefore, conventionally, the UE proactively corrects the error of the transmitting frequency according to an error value of the receiving frequency, or the BS proactively notifies the UE to revise the transmitting frequency thereof.

However, in the case of a PtoMP system and that the UE moves with a high velocity, the conventional compensation method fails to compensate the error effectively. Referring to FIG. 1, which is a diagram showing an impact of a Doppler Effect on a frequency according to an embodiment of the disclosure. When the UE moves with a high velocity, a dramatic frequency difference is generated between a sending frequency and a receiving frequency of the same signal due to a Doppler Effect. Moreover, the frequency difference changes between positive and negative values when the two sides move closer or away from each other. Generally, the Doppler Effect may last 1 second to 10 seconds, and in this period, decoding in the wireless communication fails because the error changes dramatically in an extremely short time.

It is assumed that a transmitting frequency of the BS is fc, and a preset receiving frequency of the UE is fc'. The clock systems of the BS and the UE are asynchronous, so a frequency difference fd is generated (fd=fc−fc'). In a conventional mechanism that the UE makes the compensation proactively, the UE can set the transmitting frequency to fc1'+fd, trying to maintaining the receiving frequency of the BS at fc. However, if the UE moves towards the BS with a high velocity, the actual receiving frequency of the UE is fc+fdop, where fdop is an error caused by the Doppler Effect. Moreover, conventionally, the UE further increases the transmitting frequency to fc'+fd+fdop, so the receiving frequency of the BS is increased to fc'+fd+2*fdop due to the Doppler Effect, making the error greater.

In the conventional mechanism that the BS proactively notifies the UE to perform correction, the UE needs a long reaction time while the impact period of the Doppler Effect is relatively short, so this mechanism becomes an inefficient compensation manner. Therefore, in the case of a PtoMP system and that the UE moves with a high velocity, no compensation can be made for the Doppler Effect in the conventional technology.

SUMMARY

An embodiment of the disclosure provides a frequency compensation device, applicable to a user equipment (UE) communicating with a first base station (BS). The frequency compensation device comprises a receiving module and a transmitting module. The receiving module has an offset detection unit. The offset detection unit is configured to perform the following steps. At least one first signal is received from the first BS at a first receiving frequency. A first transmitting frequency at which the first BS transmits the at least one first signal is read. A difference between the first transmitting frequency and the first receiving frequency is calculated and the difference is used as a frequency difference. The transmitting module is configured to perform the following steps. A BS parameter corresponding to the first BS is obtained. A frequency compensation value according to the BS parameter is calculated. A second transmitting frequency according to the frequency compensation value corresponding to the first BS is compensated. A second signal is sent to the first BS at the second transmitting frequency which is compensated.

Another embodiment of the disclosure provides a frequency compensation method applicable to a user equipment (UE) communicating with a first base station (BS). The frequency compensation method comprises the following steps. A BS parameter corresponding to a first BS is obtained. At least one first signal is received from the first BS at a first receiving frequency. A first transmitting frequency at which the first BS transmits the at least one first signal is read. A difference between the first transmitting frequency and the first receiving frequency is calculated. The difference is used as a frequency difference. A frequency compensation value is compensated according to the BS parameter corresponding to the first BS. A second transmitting frequency is compensated according to the frequency compensation value corresponding to the first BS. A second signal is sent to the first BS at the second transmitting frequency which is compensated.

BRIEF DESCRIPTION OF THE DRAWINGS

The disclosure will become more fully understood from the detailed description given herein below for illustration only, and thus does not limit the disclosure, wherein.

DETAILED DESCRIPTION

Figure 1:
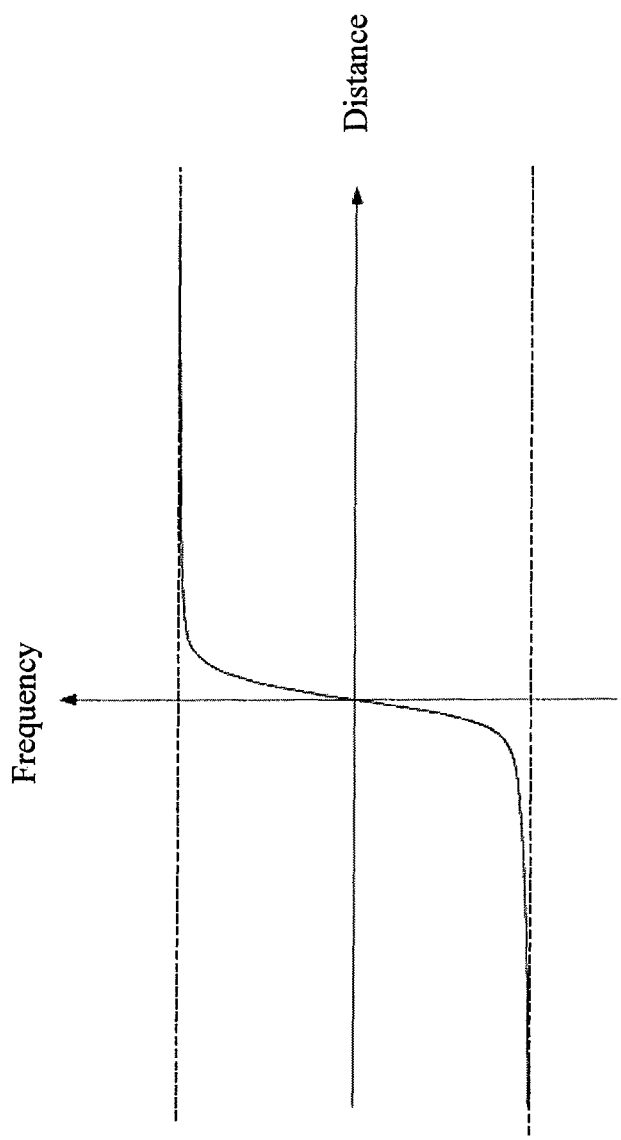
FIG. 1 is a schematic view showing an impact of a Doppler Effect on a frequency according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figures 2, 3:
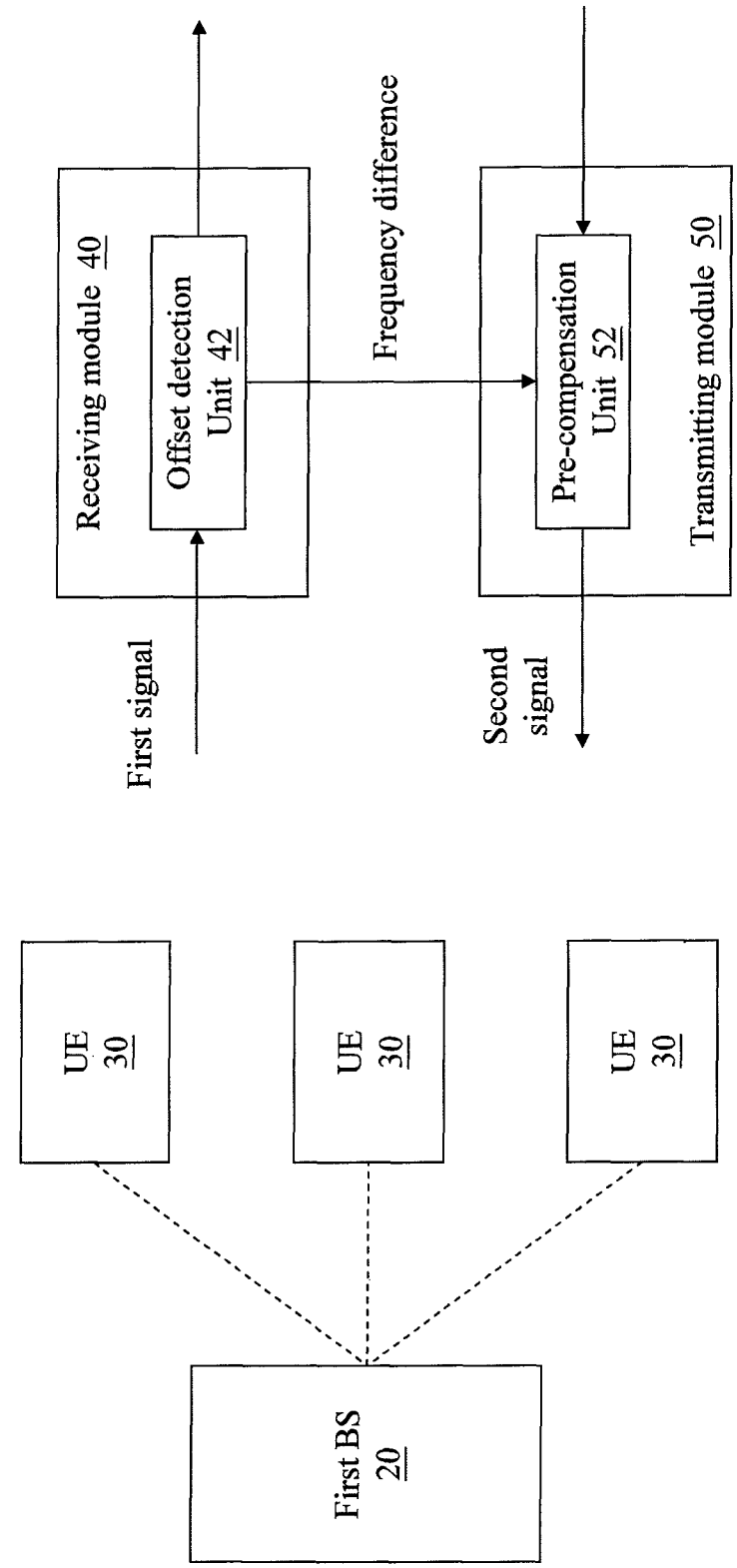
FIG. 2 is a schematic view of communication between a BS and a UE according to an embodiment.
FIG. 3 is a schematic block diagram of a frequency compensation device according to an embodiment.

The disclosure provides a frequency compensation device and a frequency compensation method thereof, which are applicable to a UE communicating with a first BS. Referring to FIG. 2 and FIG. 3 at the same time, FIG. 2 and FIG. 3 are respectively a schematic view of communication between a BS and a UE, and a schematic block diagram of a frequency compensation device according to an embodiment.

In this embodiment and some other embodiments, a first base station (BS) 20 is configured to perform wireless communication with a plurality of user equipments (UEs) 30 through wireless communication protocols, such as Worldwide Interoperability for Microwave Access (WiMAX) or Long Term Evolution (LTE). In this and some other embodiments, the frequency compensation device is disposed in each UE 30, and performs the frequency compensation method.

For example, the UE 30 is a mobile phone, a notebook computer, a tablet computer, a portable game console, or other electronic devices, and is configured to communicate with the first BS 20, so as to obtain services, such as, wireless Internet access or calling. The frequency compensation device comprises a receiving module 40 and a transmitting module 50. The receiving module 40 is configured to receive at least one first signal from the first BS 20, and the transmitting module 50 is configured to transmit a second signal to the first BS 20. In this embodiment and some other embodiments, the receiving module 40 comprises an offset detection unit 42 configured to detect a frequency difference between a frequency at which the first signal is transmitted and a frequency at which the first signal is received. In this embodiment and some other embodiments, the offset detection unit 42 is configured to detect a carrier frequency offset (CFO). In this embodiment and some other embodiments, the transmitting module 50 comprises a pre-compensation unit 52. The pre-compensation unit 52 is configured to pre-compensate, according to the frequency difference, a second transmitting frequency of the second signal to be sent to the first BS 20.

According to an embodiment, for example, the first signal has a plurality of frames, and the offset detection unit 42 is configured to calculate and to perform compensation on a corresponding frequency difference for each frame. In other words, in this embodiment and some other embodiments, the frequency compensation method is performed synchronously with the frames.

In this embodiment and some other embodiments, the first BS 20 and the UE 30 each have an oscillator for generating a clock. For example, the oscillator is a quartz oscillator (also known as a crystal oscillator) or a ceramic oscillator. In this embodiment and some other embodiments, the oscillators of the first BS 20 and the UE 30 have high precision, for example, the precision is 10 to 12 degree.

First, the concept of compensation for the Doppler Effect is briefly illustrated as follows. When the position of the first BS 20 remains unchanged and the UE 30 continuously moves towards the first BS 20 with a certain velocity, a first signal that the first BS 20 transmits to the UE 30 has a frequency error. When the frequency at which the UE 30 receives the first signal is directly used as a transmitting frequency of the UE 30 without compensation, a second signal that the UE 30 returns to the first BS 20 has a doubled frequency error. Therefore, the UE 30 returns the second signal at, for example, a frequency that is one frequency error lower than an expected receiving frequency of the second signal, so as to offset the frequency error caused by the Doppler Effect. Similarly, when the UE 30 continuously moves away from the first BS 20 at a certain velocity, the second signal is sent at, for example, a frequency that is one frequency error higher than an the expected receiving frequency of the second signal, so as to offset the frequency error caused by the Doppler Effect.

In the communication process, a first signal is transmitted from the first BS 20 at a first transmitting frequency. The receiving module 40 of the UE 30 receives the first signal at a first receiving frequency, and the transmitting module 50 of the UE 30 transmits a second signal with a second transmitting frequency which is compensated (i.e., after compensation). The first BS 20 then receives the second signal at a second receiving frequency.

Figure 4:
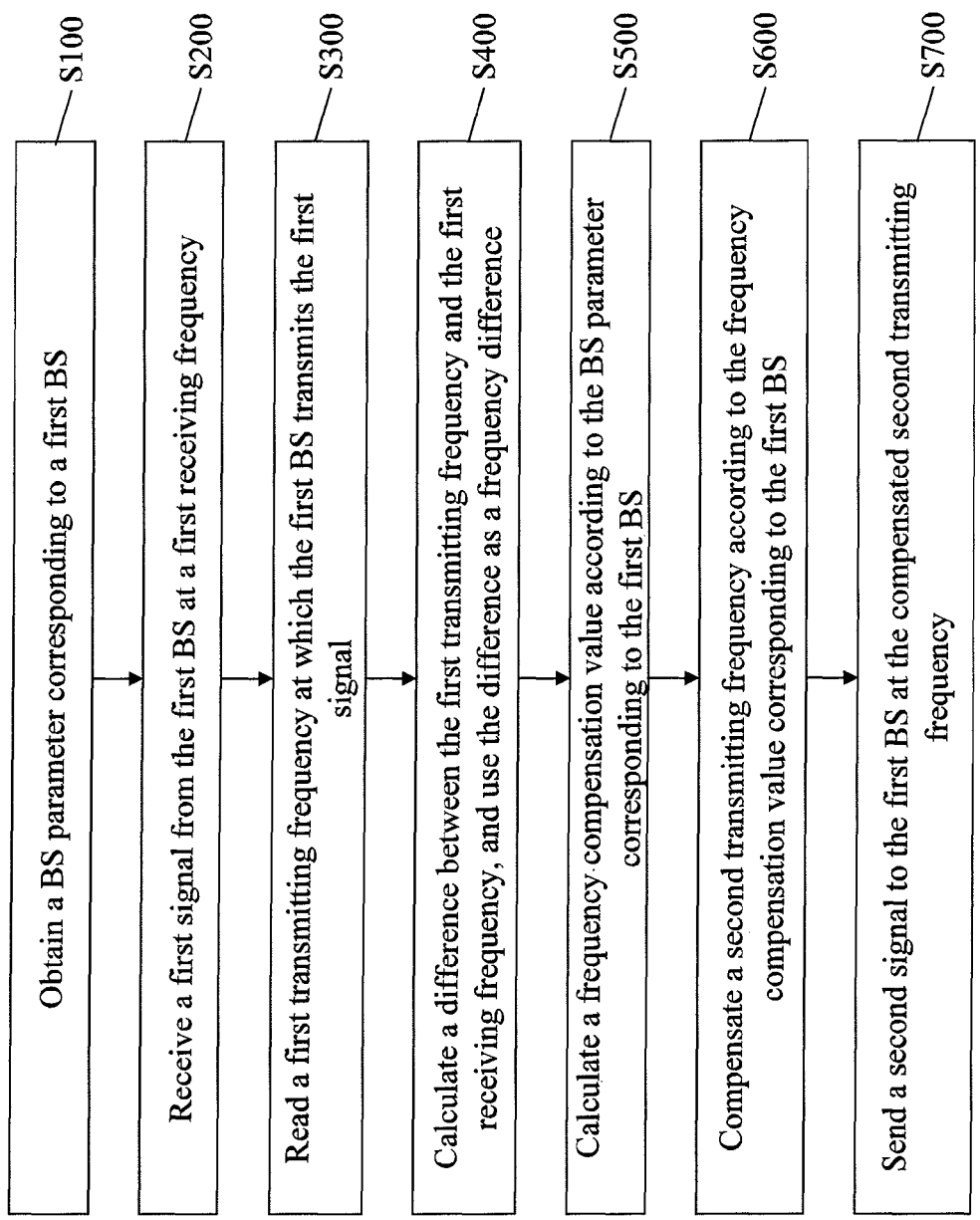
FIG. 4 is a flow chart of a frequency compensation method according to an embodiment.

Referring to FIG. 4, which is a flow chart of a frequency compensation method according to an embodiment.

In this embodiment and some other embodiments, a UE 30 first obtains a BS parameter corresponding to a first BS 20 (Step S100). According to an embodiment, the transmitting module 50 receives the BS parameter from, for example, an upper-layer processing module outside the frequency compensation device. Moreover, as long as the UE 30 does not perform BS handover (namely, switch) with the first BS 20, the transmitting module 50 may constantly use the same BS parameter for frequency compensation.

In this embodiment and some embodiments, the receiving module 40 first receives at least one first signal from the first BS 20 at a first receiving frequency (Step S200), and reads a first transmitting frequency at which the first BS 20 transmits the first signal (Step S300). In this embodiment, an offset detection unit 42 of the receiving module 40 receives the first signal through, for example, Orthogonal Frequency Division Multiplex (OFDM) or Code Division Multiple Access (CDMA).

Figure 5:
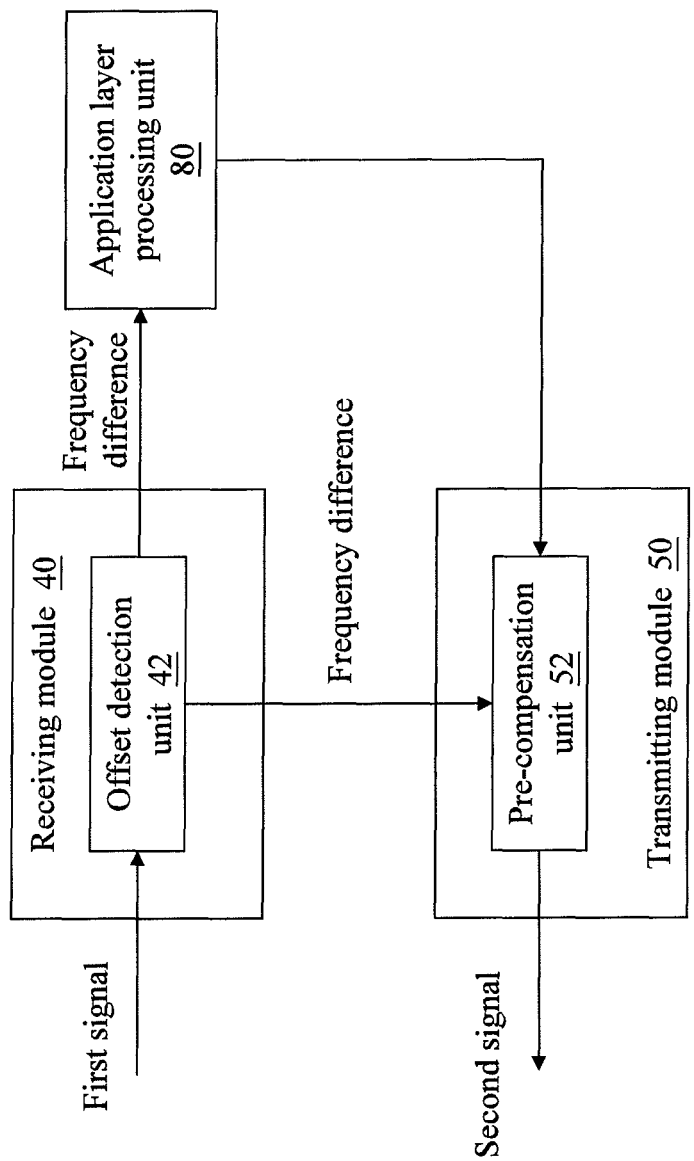
FIG. 5 is a schematic block diagram of a frequency compensation device according to another embodiment.

According to an embodiment, the frequency compensation device further comprises an application layer processing unit 80, as shown in FIG. 5. In this embodiment and some embodiments, the application layer processing unit 80 is configured to read a first transmitting frequency from a system broadcast signal and to send the first transmitting frequency to a pre-compensation unit 52 of the transmitting module 50.

In this embodiment and some embodiments, the application layer processing unit 80 is configured to search a signal coverage (or referred to as a cell) so as to obtain a signal coverage search result comprising communication control information. The application layer processing unit 80 is further configured to read the first transmitting frequency and a second receiving frequency from the signal coverage search result. In addition, in this embodiment and some other embodiments, the application layer processing unit 80 is configured to perform a search in other manners, so as to obtain the first transmitting frequency and the second receiving frequency, and the application layer processing unit 80 is further configured to send the BS parameter to the pre-compensation unit 52.

The offset detection unit 42 calculates a difference between the first transmitting frequency and the first receiving frequency, and uses the difference as a frequency difference (Step S400). In this embodiment and some other embodiments, an absolute value of the first transmitting frequency minus the first receiving frequency is used as the frequency difference.

In this embodiment and some embodiments, the offset detection unit 42 also calculates a displacement velocity (i.e. displacement rate) of the UE 30 according to the frequency difference. The first signal is sent by the first BS 20 which is located at a fixed position, and is received by the receiving module 40 that continuously moves with the displacement velocity.

A formula for calculating the frequency change according to the Doppler Effect is as follows:

$$f' = f \times \frac{v + v_s}{v - v_o}, \qquad \text{(Formula 1)}$$

where f is a frequency at which a source sends a signal, f' is a frequency at which an observer receives a signal, v is a wave velocity, vs is a moving velocity of the source, vo is a moving velocity of the observer. Herein, the wave velocity is the velocity of light, and the moving velocity of the source is zero.

After transposition on Formula 1, the displacement velocity of the UE 30 is calculated according to the following formula:

$$v_p = v \times \frac{f_d}{f_r}, \qquad \text{(Formula 2)}$$

where vp is a displacement velocity of the UE 30, v is the velocity of light, fd is the frequency difference, and fr is the first transmitting frequency.

After obtaining the frequency difference, in this embodiment and some embodiments, the offset detection unit 42 obtains the BS parameter corresponding to the first BS 20, and sends the frequency difference to the pre-compensation unit 52 of the transmitting module 50. The BS parameter is calculated according to the first transmitting frequency and the second transmitting frequency. For example, the BS parameter is a calculation result of the second transmitting frequency divided by the first transmitting frequency.

A formula for calculating the BS parameter is as follows:

$$M = \frac{f_t}{f_r}, \qquad \text{(Formula 3)}$$

where M is the BS parameter, fr is the first transmitting frequency, and ft is the second transmitting frequency.

According to an embodiment, the above-mentioned application layer processing unit 80 is configured to calculate the BS parameter corresponding to the first BS 20, and is configured to send the BS parameter to the pre-compensation unit 52. The pre-compensation unit 52 then calculates a frequency compensation value according to the BS parameter corresponding to the first BS 20 (Step S500). However, in this embodiment and some embodiments, the application layer processing unit 80 also receives the frequency difference from the offset detection unit 42, calculates the frequency compensation value according to the BS parameter, and then sends the frequency compensation value to the pre-compensation unit 52. That is to say, the frequency compensation value is calculated and obtained by the pre-compensation unit 52 or by the application layer processing unit 80.

According to an embodiment, both the offset detection unit 42 and the pre-compensation unit 52 are implemented at a hardware layer. Before compensation is performed according to the frequency difference, in this embodiment and some other embodiments, the frequency difference is first sent to the application layer processing unit 80 or other upper-layer processing modules outside the frequency compensation device for filtering or other processing, so as to prevent the precision of the frequency difference from being affected by noise. However, the latency or the delay of signal processing may be slightly increased.

The pre-compensation unit 52 compensates the second transmitting frequency according to the frequency compensation value corresponding to the first BS 20 (Step S600). The transmitting module 50 sends a second signal to the first BS 20 at the second transmitting frequency which is compensated (Step S700). The pre-compensation unit 52 uses a calculation result of the second transmitting frequency minus a product of the frequency difference and the BS parameter as the compensated second transmitting frequency.

A formula for compensating the second transmitting frequency is as follows:

$$f_t' = f_t - f_d \times M = \qquad \text{(Formula 4)}$$
$$f_t - f_d \times \frac{f_t}{f_r} = f_t - \frac{f_r \times v_p}{v} \times \frac{f_t}{f_r} = \frac{f_t \times (v - v_p)}{v},$$

where ft is the uncompensated second transmitting frequency (namely, before compensation or is not compensated), ft' is the compensated second transmitting frequency (namely, after compensation or is compensated), fd is the frequency difference, M is the BS parameter corresponding to the first BS 20, fr is the first transmitting frequency, v is the velocity of light, and vp is the displacement velocity of the UE 30.

The first BS 20 receives the second signal at a second receiving frequency, and a formula for calculating the second receiving frequency is as follows:

$$f_r' = f_t' \times \frac{v}{v - v_p} = \frac{f_t \times (v - v_p)}{v} \times \frac{v}{v - v_p} = f_t, \qquad \text{(Formula 5)}$$

where fr' is the second receiving frequency, ft is the uncompensated second transmitting frequency (namely, before compensation or is not compensated), ft' is the compensated second transmitting frequency (namely, after compensation or is compensated), v is the velocity of light, and vp is the displacement velocity of the UE 30.

The second receiving frequency fr' at which the first BS 20 receives the second signal is the same as the uncompensated second sending frequency ft. Therefore, the second signal received by the first BS 20 does not have any frequency offset.

Moreover, the foregoing displacement velocity can be either a positive number or a negative number. When the displacement velocity is a positive number, it indicates that the UE 30 is moving close to the first BS 20, and when the displacement velocity is a negative number, it indicates that the UE 30 is moving away from the first BS 20.

According to another embodiment, the frequency difference obtained by the offset detection unit 42 is also provided to a compensation unit 44 of the receiving module 40, so as to compensate the first signal.

Figure 6:
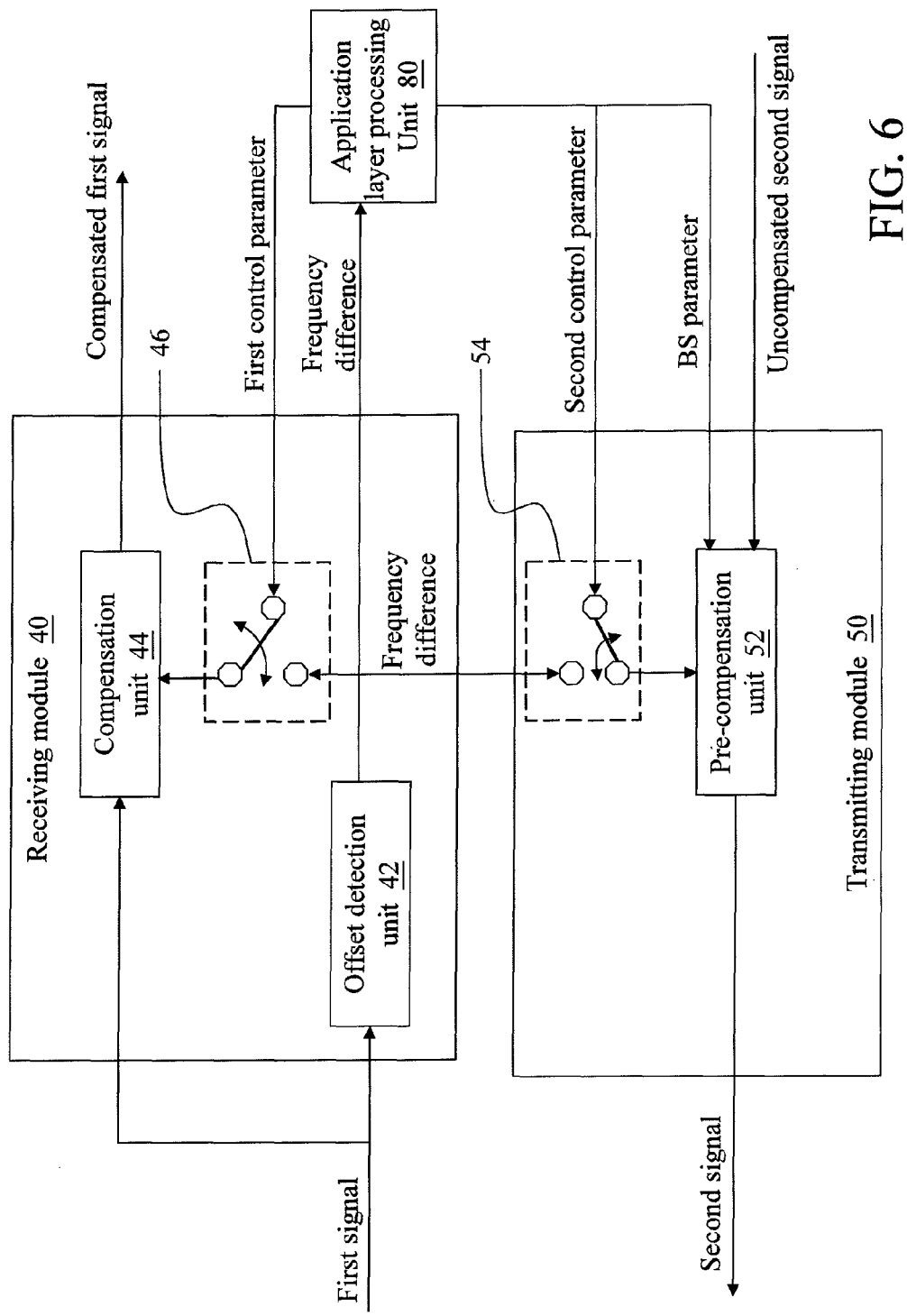
FIG. 6 is a schematic block diagram of a frequency compensation device according to still another embodiment.

Referring to FIG. 6, which is a schematic block diagram of a frequency compensation device according to another embodiment. In this embodiment and some embodiments, the offset detection unit 42 sends the frequency difference to the compensation unit 44 or the upper-layer application layer processing unit 80, and sends the frequency difference to the pre-compensation unit 52. In this embodiment and some embodiments, the compensation unit 44 also receives a first control parameter from an upper layer through a first selector switch 46, compensates the first signal according to the first control parameter, and then outputs the compensated first signal. For example, the first control parameter is the frequency difference that undergoes the filtering processing or other pre-processing. In this embodiment and some embodiments, the upper-layer application layer processing unit 80 receives the frequency difference from the offset detection unit 42, processes the frequency difference, and then sends the processed frequency difference to the compensation unit 44.

Similarly, the pre-compensation unit 52 first obtains the uncompensated second signal and the BS parameter from the application layer processing unit 80, and then receives a second control parameter from the application layer processing unit 80 through a second selector switch 54. For example, the second control parameter is the frequency difference that undergoes the filtering processing or other pre-processing. The pre-compensation unit 52 receives the second control parameter, and performs processing and compensation in the foregoing manner. In this embodiment and some embodiments, the second control parameter is the frequency compensation value for the second transmitting frequency, such that the pre-compensation unit 52 receives the second control parameter and then directly performs compensation according to the second control parameter, so as to improve the operation flexibility of the entire frequency compensation device.

Figure 7:
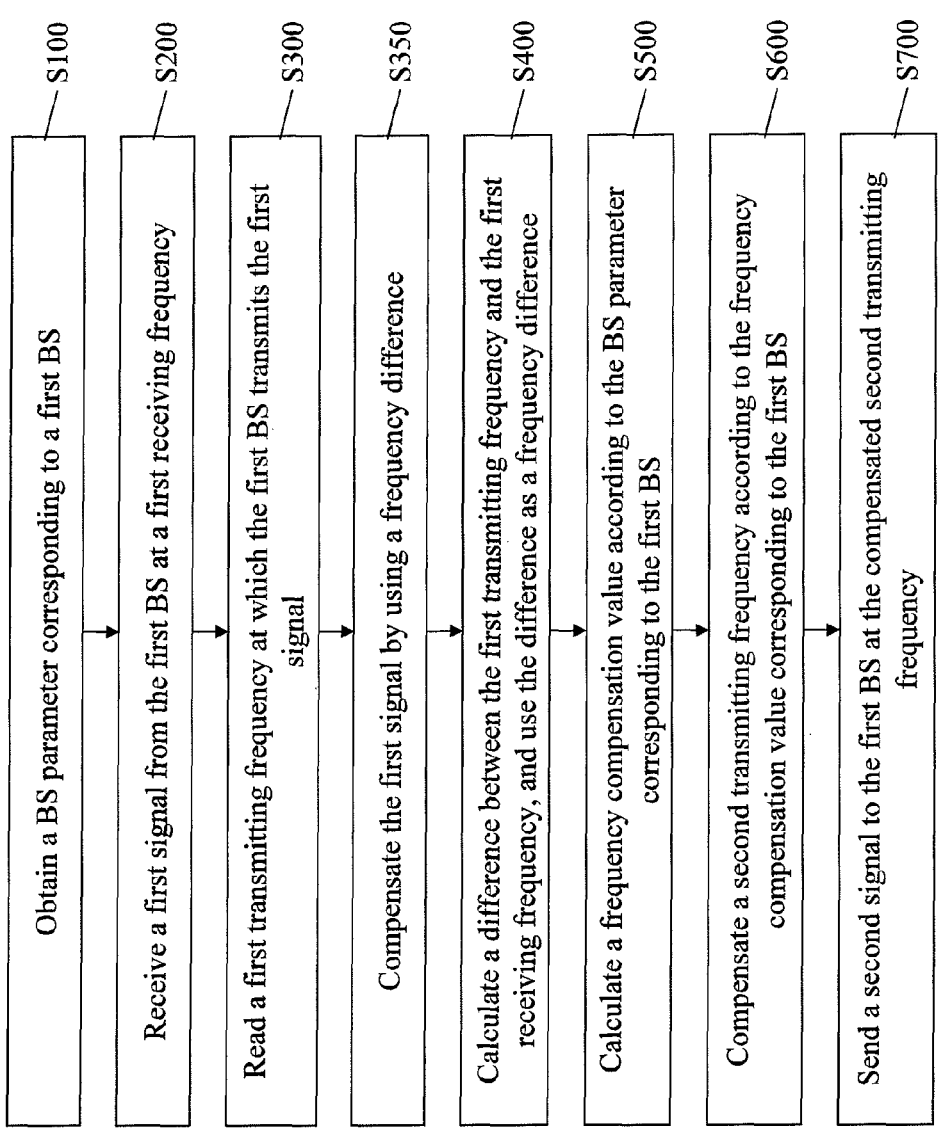
FIG. 7 is a flow chart of a frequency compensation method according to another embodiment.

Referring to FIG. 7, which is a flow chart of a frequency compensation method according to another embodiment. In the embodiment shown in FIG. 7 and some embodiments, after the frequency difference is calculated, the compensation unit 44 compensates the first signal by using the frequency difference (Step S350). For example, the compensation unit 44 eliminates, according to the frequency difference, the frequency offset of the first signal generated due to the Doppler Effect. Moreover, in this embodiment and some embodiments, the compensation unit 44 sends the first signal which is compensated to a decoder and a channel equalizer connected with the frequency compensation device. Subsequently, the decoder and the channel equalizer decode each frame of the first signal.

In this embodiment and some embodiments, the offset detection unit 42 calculates a corresponding frequency difference for each frame in real time. The compensation unit 44 and the decoder both perform compensation and decoding at the same time or with a delay of at least one frame. In this embodiment and some embodiments, other filters or compensation units are disposed between the offset detection unit 42 and the decoder, thereby performing channel compensation or other processing on each frame of the first signal.

Figure 8:
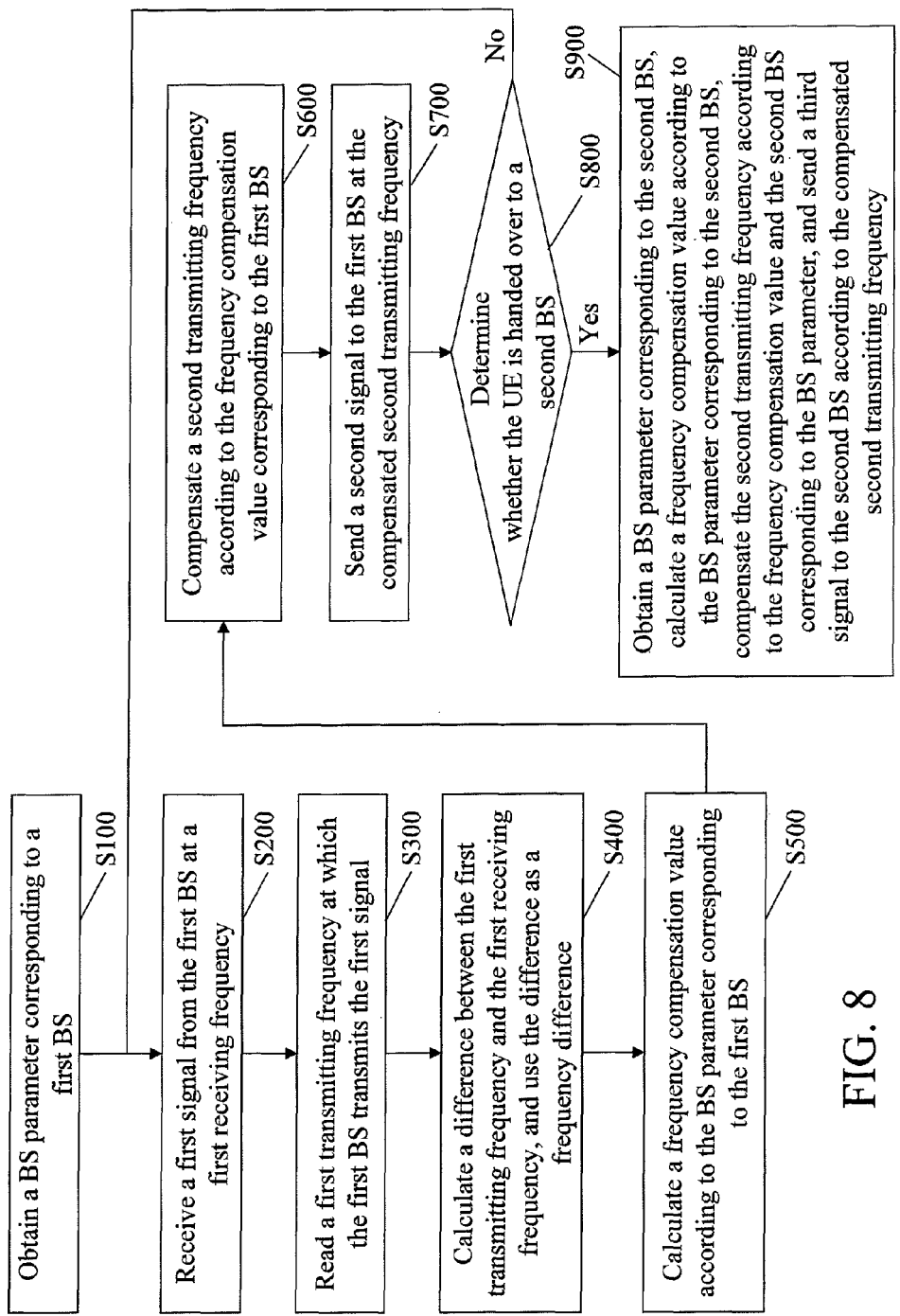
FIG. 8 is a flow chart of a frequency compensation method according to still another embodiment.
Figure 9:
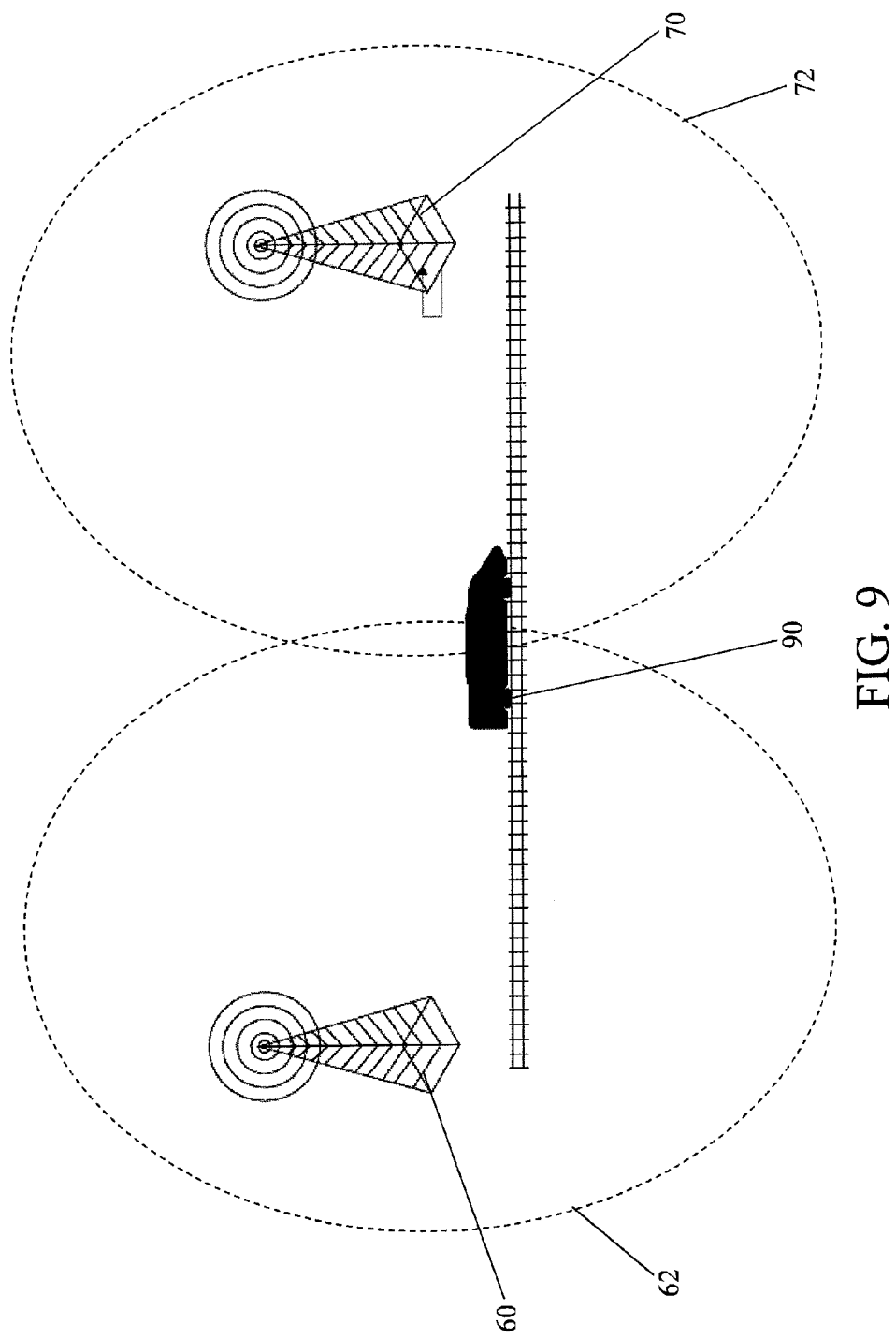
FIG. 9 is a schematic view of a second. BS according to an embodiment.

According to still another embodiment, when the UE 30 undergoes a BS handover, in this embodiment and some other embodiments, the frequency compensation device calculates another BS parameter according to another BS. Referring to FIG. 8 and FIG. 9 at the same time, FIG. 8 is a flow chart of a frequency compensation method and FIG. 9 is a schematic view of a second BS according to still another embodiment.

It is assumed that the first BS 60 has a first signal coverage 62 and receives a second signal, and a second BS 70 has a second signal coverage 72 and receives at least one fourth signal. The UE 30 is located on a continuously moving train 90. The train 90 is currently located in an overlapping area between the first signal coverage 62 and the second signal coverage 72, and is going to leave the first signal coverage 62 and move to the second signal coverage 72. When the UE 30 communicates with the first BS 60, the UE 30 needs to receive a first signal and to transmit a second signal. Similarly, when the UE 30 communicates with the second BS 70, the UE 30 receives at least one third signal and transmit a fourth signal. The first signal and the third signal have the same frequency or different frequencies, and the second signal and the fourth signal have the same frequency or different frequencies.

In this embodiment and some embodiments, the application layer processing unit 80 switches the receiving frequency of the receiving module 40 according to a requirement of an upper-layer communication protocol, so as to detect whether a third signal of the second BS 70 is received, and determine whether the UE is handed over to the second BS 70 (Step S800). When the second BS 70 is detected, the BS parameter corresponding to the second BS 70 is obtained, a frequency compensation value is calculated according to the BS parameter corresponding to the second BS 70, the second transmitting frequency is compensated according to the frequency compensation value and the BS parameter corresponding to the second BS 70, and a third signal is sent to the second BS 70 according to the second transmitting frequency which is compensated (Step S900).

In this and some other embodiment, typically, when the second. BS 70 is detected, the application layer processing unit 80 calculates the BS parameter corresponding to the second BS 70, sends the BS parameter to the pre-compensation unit 52, and switches the transmitting frequency of the transmitting module 50, so as to meet a requirement of the fourth signal. The pre-compensation unit 52 compensates the second transmitting frequency according to the BS parameter corresponding to the second BS 70 and the frequency difference, and the pre-compensation unit 52 sends a fourth signal to the second BS 70 at the second transmitting frequency which is compensated.

In this embodiment and some embodiments, when the UE 30 is located in the overlapping area of the first signal coverage 62 and the second signal coverage 72, the frequency compensation device performs handover synchronously through a communication protocol used in the upper layer and other modules, so as to communicate with the first BS 60 and the second BS 70 at the same time, and to compensate the second signal and the fourth signal respectively using the BS parameters corresponding to the first BS 60 and the second BS 70.

In this and some other embodiments, the offset detection unit 42 and the pre-compensation unit 52 are both implemented in a hardware layer rather than an application layer, so Step S100 to Step S600 are performed quickly, so as to calculate the frequency difference and compensate the second transmitting frequency according to the frequency difference. Furthermore, in this embodiment and some other embodiments, the offset detection unit 42 directly sends the frequency difference to the pre-compensation unit 52, and the pre-compensation unit 52 is configured to directly compensate the second transmitting frequency by using a simple multiplier after obtaining the BS parameter. Therefore, the frequency compensation device is capable of performing compensation in real time, thereby minimizing the possibility of a signal decoding failure. Moreover, the pre-compensation unit 52 performs updating in each frame through receiving the frequency difference sent by the detection unit 42, so the improvement in efficiency brought about by the compensation is prominently enhanced.

In this embodiment and some embodiments, different BSs may correspond to different BS parameters. When the UE is handed over from one BS to another BS in communication, the application layer processing unit 80 needs to update the BS parameter and send the updated BS parameter to the pre-compensation unit 52, so that the receiving module 40 and the transmitting module 50 may perform compensation using the updated BS parameter. However, in general cases, even if the UE 30 moves with a high velocity, the BS handover only needs to be performed at an interval of one second or dozens of seconds. Compared with the method for calculating the BS parameter at the pre-compensation unit 52, though slightly adding the load of the Central Processing Unit (CPU) of the UE 30, the method for processing the BS parameter at the application layer processing unit 80 and sending the BS parameter to the pre-compensation unit 52 saves one multiplier of the pre-compensation unit 52. However, according to another embodiment, the pre-compensation unit 52 also comprises a multiplier configured to calculate the BS parameter, so that the BS parameter does not need to be received from the application layer processing unit 80.

To sum up, in the frequency compensation device and the frequency compensation method thereof, the receiving module detects the frequency difference and calculates a frequency compensation value in real time at the hardware layer, and immediately sends the second frequency compensation value to the transmitting module in the hardware layer, thereby effectively improving the processing efficiency of compensation. The frequency compensation device disposed in the UE may directly compensate the received first signal and the second signal to be sent by using the hardware layer architecture in a high-speed environment, so that wireless communication between the UE and the BS is completely unblocked and not obstructed.

What is claimed is:

1. A frequency compensation device for a user equipment (UE) communicating with a first base station (BS), comprising:
    a receiving module, having an offset detection unit, and the offset detection unit is configured to perform steps of:
    receiving at least one first signal from the first BS at a first receiving frequency;
    reading a first transmitting frequency at which the first BS transmits the at least one first signal; and
    calculating a difference between the first transmitting frequency and the first receiving frequency, and using the difference as a frequency difference; and
    a transmitting module configured to perform steps of:
    obtaining a BS parameter corresponding to the first BS;
    calculating a frequency compensation value according to the BS parameter;
    compensating a second transmitting frequency according to the frequency compensation value corresponding to the first BS; and
    sending a second signal to the first BS at the second transmitting frequency which is compensated.

2. The frequency compensation device according to claim 1, further comprising:
    an application layer processing unit configured to read the first transmitting frequency from a system broadcast signal or to read the first transmitting frequency from a signal coverage search result, and to send the first transmitting frequency to the transmitting module.

3. The frequency compensation device according to claim 1, wherein the BS parameter is a calculation result of the second transmitting frequency divided by the first transmitting frequency.

4. The frequency compensation device according to claim 3, further comprising:
    an application layer processing unit configured to calculate the BS parameter corresponding to the first BS, and to send the BS parameter to the transmitting module.

5. The frequency compensation device according to claim 4, wherein, when the application layer processing unit detects a second BS, the application layer processing unit calculates a BS parameter corresponding to the second BS, and sends the BS parameter to the offset detection unit, so as to compensate the transmitting frequency according to the BS parameter corresponding to the second BS, and the transmitting module sends a third signal to the second BS at the second transmitting frequency which is compensated.

6. The frequency compensation device according to claim 1, wherein the second transmitting frequency which is compensated is a calculation result of the second transmitting frequency minus a product of the frequency difference and the BS parameter.

7. The frequency compensation device according to claim 1, wherein the receiving module further comprises:
    a compensation unit configured to compensate the first signal by using the frequency difference.

8. The frequency compensation device according to claim 1, wherein the receiving module is configured to receive the at least one signal through Orthogonal Frequency Division Multiplex (OFDM) or Code Division Multiple Access (CDMA).

9. A frequency compensation method for a user equipment (UE) communicating with a first base station (BS), comprising:
    obtaining a BS parameter corresponding to the first BS;
    receiving at least one first signal from the first BS at a first receiving frequency;
    reading a first transmitting frequency at which the first BS transmits the at least one first signal;
    calculating a difference between the first transmitting frequency and the first receiving frequency, and using the difference as a frequency difference;
    calculating a frequency compensation value according the BS parameter corresponding to the first BS;
    compensating a second transmitting frequency according to the frequency compensation value corresponding to the first BS; and
    sending a second signal to the first BS at the second transmitting frequency which is compensated.

10. The frequency compensation method according to claim 9, wherein the step of reading the first transmitting frequency at which the first BS transmits the at least one first signal is reading the first transmitting frequency from a system broadcast signal or reading the first transmitting frequency from a signal coverage search result.

11. The frequency compensation method according to claim 9, wherein the BS parameter is a calculation result of the second transmitting frequency divided by the first transmitting frequency.

12. The frequency compensation method according to claim 9, further comprising:
    determining whether a second BS is detected; and
    when the second BS is detected, obtaining a BS parameter corresponding to the second BS, calculating the frequency compensation value according to the BS parameter corresponding to the second BS, compensating the second transmitting frequency according to the frequency compensation value and the BS parameter corresponding to the second BS, and sending a third signal to the second BS at the second transmitting frequency which is compensated.

13. The frequency compensation method according to claim 9, wherein the second transmitting frequency which is compensated is a calculation result of the second transmitting frequency minus a product of the frequency difference and the BS parameter.

14. The frequency compensation method according to claim 9, further comprising:
    compensating the first signal by using the frequency difference.

15. The frequency compensation method according to claim 9, wherein the at least one first signal is received through Orthogonal Frequency Division Multiplex (OFDM) or Code Division Multiple Access (CDMA).

* * * * *